(12) United States Patent
Totokawa

(10) Patent No.: US 6,913,947 B2
(45) Date of Patent: Jul. 5, 2005

(54) MULTI-LAYER CIRCUIT BOARD AND METHOD OF MANUFACTURING THE SAME

(75) Inventor: Masashi Totokawa, Nagoya (JP)

(73) Assignee: Denso Corporation, Kariya (JP)

(*) Notice: Subject to any disclaimer, the term of this patent is extended or adjusted under 35 U.S.C. 154(b) by 92 days.

(21) Appl. No.: 10/680,116

(22) Filed: Oct. 8, 2003

(65) Prior Publication Data
US 2004/0082189 A1 Apr. 29, 2004

(30) Foreign Application Priority Data
Oct. 25, 2002 (JP) ......................... 2002-311650

(51) Int. Cl.⁷ .................. H01L 21/44; H01L 21/48; H01L 21/50
(52) U.S. Cl. .................. 438/106; 438/107; 257/791; 257/787; 257/E39.011
(58) Field of Search ................ 438/106, 107; 257/791, 787, E39.011

(56) References Cited

U.S. PATENT DOCUMENTS 5,672,226 A * 9/1997 Deardorf .................. 156/288
6,228,467 B1 5/2001 Taniguchi et al.

FOREIGN PATENT DOCUMENTS

JP A-H11-163499 6/1999
JP A-2002-134878 5/2002

* cited by examiner

Primary Examiner—Craig A. Thompson
(74) Attorney, Agent, or Firm—Posz Law Group, PLC

(57) ABSTRACT

A multi-layer circuit board is manufactured by laminating and bonding together a plurality of resin films, on each of which a circuit pattern is directly drawn by injecting ink. The ink includes metal particles, having a diameter in the order of nanometers, dispersed therein. At the same time when the laminated resin films are bonded together under pressure and heat, the metal particles in the ink are sintered, thereby forming a solid electrical circuit printed on the resin film. Since the circuit pattern is directly drawn on the resin film, the process of manufacturing the multi-layer circuit board is simplified.

11 Claims, 5 Drawing Sheets

MULTI-LAYER CIRCUIT BOARD AND METHOD OF MANUFACTURING THE SAME

CROSS-REFERENCE TO RELATED APPLICATION

This application is based upon and claims benefit of priority of Japanese Patent Application No. 2002-311650 filed on Oct. 25, 2002, the content of which is incorporated herein by reference.

BACKGROUND OF THE INVENTION

1. Field of the Invention

The present invention relates to a multi-layer circuit board formed by laminating and bonding plural resin films and a method of manufacturing the same.

2. Description of Related Art

An example of a method of manufacturing a multi-layer circuit board is shown in JP-A-2000-38464. An essence of a method of preparing a resin film with a circuit pattern in the manufacturing method is illustrated in FIGS. 6A–6G attached hereto. As shown in FIG. 6A, a copper foil 2 is pasted to a resin film 1 which is made of thermoplastic resin such as liquid crystal polymer (LCP). Then, as shown in FIG. 6B, a resist 3 is coated on the copper foil 2, and the coated resist 3 is covered with a photo-mask 4. A circuit pattern is developed on the copper foil 2 after it is exposed to light. Then, as shown in FIG. 6C, the copper foil 2 is etched, and the copper foil 2 other than the circuit pattern is removed. Then, as shown in FIG. 6D, the resist 3 covering the circuit pattern is removed, thus forming a resin film 10 with a circuit pattern.

As shown in FIG. 6E, both surfaces of the resin film 1 on which a circuit pattern is formed are covered with protecting films 5. Then, dead-ended holes 6 are formed through the resin film 1 and the bottom protecting film 5 by radiating a laser beam. Then, as shown in FIG. 6F, the dead-ended holes 6 are filled with conductive paste 7. Finally, the protecting films 5 are removed, thus forming a resin film 10 having the circuit pattern and the dead-ended holes 6 filled with conductive paste 7.

According to the method disclosed in JP-A-2000-38464, a plurality of resin films 10 thus made are laminated and bonded together by pressurizing the laminated resin films 10 under heat. At the same time, the conductive paste 7 is sintered, thereby forming conductors electrically connecting neighboring circuit patterns.

In the conventional method, as shown in FIGS. 6A–6G, the circuit pattern is formed under a wet process, i.e., a photolithography process. Therefore, the number of steps included in the process of forming the circuit pattern is considerably large, and the wet process is complex. Further, many photo-masks 4 are required for forming the circuit patterns on each layer constituting a multi-layer circuit board. In addition, the circuit pattern is formed from a relatively thick copper foil 2. Therefore, a fine circuit pattern in a high density cannot be made.

SUMMARY OF THE INVENTION

The present invention has been made in view of the above-mentioned problem, and an object of the present invention is to provide a simplified method of manufacturing a multi-layer circuit board. Another object of the present invention is to provide a multi-layer circuit board manufactured under such a simplified method.

The multi-layer circuit board is manufactured in the following manner. First, through-holes are formed in a resin film made of a material such as thermoplastic resin. The through-holes are filled with conductive paste. Then, a circuit pattern is directly drawn on a surface of the resin film by injecting ink from an ink injector. The circuit pattern is drawn to contact the conductive paste filling the through-hole. The ink includes small metal particles dispersed in solvent. The particle of a metal, such as Ag, Au, Pt or Sn, has a diameter in the order of nanometers, e.g., smaller than 50 nanometers.

It is possible to include a resistor pattern in the circuit pattern. For drawing the resistor pattern, the metal particles included in the ink are changed to metal particles having a higher resistance. Two or more kinds of metal particles may be mixed in the ink. Since the size of the metal particles is small, it is possible to draw a fine circuit pattern having a high density.

A plurality of resin films each having a circuit pattern drawn thereon and through-holes filled with the conductive paste are laminated. Then, the laminated resin films are pressed and heated. By pressing and heating, the resin films are bonded together. At the same time, the ink with which the circuit pattern is drawn and the conductive paste with which the through-holes are filled are sintered. Thus, the multi-layer circuit board having circuits connected through the layers. Since the size of the metal particles in the ink is small, the circuit pattern can be sintered at a low temperature and at the same time as the resin films are bonded.

It is also possible to use the ink with which the circuit pattern is drawn as the paste for filling the through-holes. In this case, the through-holes can be filled with the ink injected from the ink injector. Before laminating the plurality of resin films, it is preferable to provisionally sinter the ink and the paste to make handling of the resin films easier in the following processes.

According to the present invention, the circuit pattern is directly drawn on the resin film without using conventional photolithography processes. Therefore, the process of manufacturing the multi-layer circuit board can be greatly simplified. Other objects and features of the present invention will become more readily apparent from a better understanding of the preferred embodiment described below with reference to the following drawings.

DETAILED DESCRIPTION OF THE PREFERRED EMBODIMENT

Figure 1A:
FIGS. 1A–1E are drawings showing a process of forming a resin film with a circuit pattern formed thereon, each showing a cross-sectional view of the resin film in each step.

A preferred embodiment of the present invention will be described with reference to accompanying drawings. A process of forming a circuit pattern $2i$ on a resin film 1 and through-holes 6 filled with conductive paste 7 in the resin film 1 is shown in FIGS. 1A–1E. First, as shown in FIG. 1A, a protecting film $1c$ is pasted on a bottom surface of a resin film 1. The resin film 1 is made of thermoplastic resin such as liquid crystal polymer (LCP). The resin film 1 may be made of thermoplastic resin such as polyether-etherketone, a mixture of polyether-etherketone and polyether-imide, polyphenylene sulfide or the like. Alternatively, the resin film 1 may be made of thermosetting resin such as epoxy resin including glass fibers.

Figure 1B:
Figure 1C:
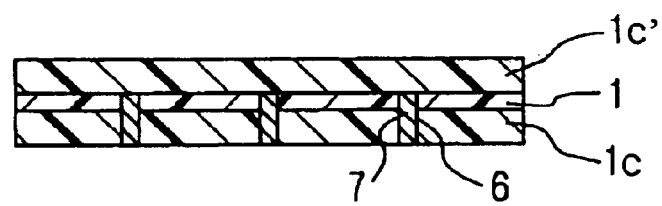
Figure 1D:
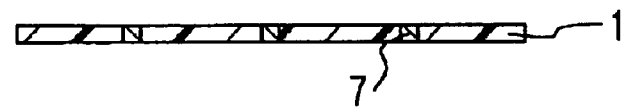

Then, as shown in FIG. 1B, through-holes 6 are formed through the protecting film $1c$ and the resin film 1 by radiating a laser beam. Then, as shown in FIG. 1C, another protecting film $1c'$ is pasted on the upper surface of the resin film 1, so that the through-holes 6 are closed. Then, the closed through-holes 6 are filled with conductive paste 7, using a squeegee. The conductive paste 7 is made by mixing metal particles, such as Ag and Sn particles, with binder resin or organic solvent and kneading into paste. The metal particles may be particles of Au and Sn, or Cu and Sn. Since the Sn is included in the conductive paste 7, the conductive paste 7 can be sintered at a relatively low temperature in a later process. Then, as shown in FIG. 1D, the protecting films $1c$ and $1c'$ pasted on both surfaces of the resin film 1 are removed.

Figure 1E:
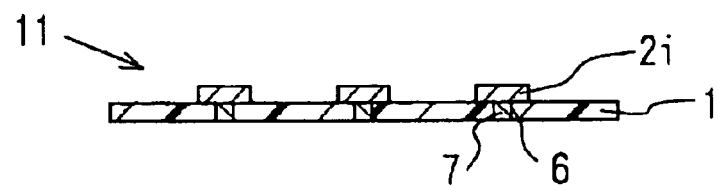

Then, a circuit pattern $2i$ is drawn with ink on the upper surface of the resin film 1, as shown in FIG. 1E, forming a completed resin film 11 having the circuit pattern $2i$ and the through-holes 6 filled with conductive paste 7. The process of forming the circuit pattern $2i$ will be described in detail with reference to FIGS. 2 and 3.

Figure 2:
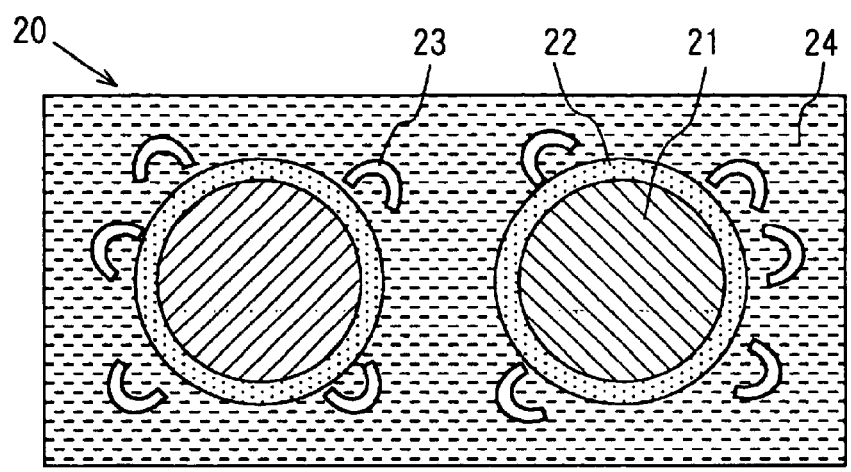
FIG. 2 is a schematic view showing ink that includes small metal particles dispersed in solvent.

The ink for drawing the circuit pattern on the resin film 1 is schematically shown in FIG. 2. Small metal particles 21, e.g., Ag particles, in the order of nanometers are dispersed in solvent 24. The surface of each metal particle 21 is covered with dispersing agent 22 by a wetting treatment, so that the metal particles 21 are well dispersed in the solvent, being prevented from sticking to one another. Catching agent 23 that catches the dispersing agent in the sintering process performed later is also mixed in the solvent 24. Preferably, the diameter of the metal particle such as the Ag particle dispersed in the solvent 24 is set to a level smaller than 50 nanometer so that its sintering process can be performed at a lowest possible temperature.

Materials that have a group including lone-pair electrodes of nitrogen, oxygen of sulfur and make a coordinate bond with the metal particles 21 can be used as the dispersing agent 22. For example, following materials can be used: alkylamine (C8–C18) that has an amino-group as a group including lone-pair electrodes of nitrogen; alkanethiol (C8–C18) that has a sulfanil group (—SH—) as a group including lone-pair electrodes of sulfur; and alkanediol, such as ethylene glycol, diethylene glycol or polyethylene glycol, that has a hydroxy group as a group including lone-pair electrodes of oxygen.

As the catching agent 23, materials that react with groups including nitrogen, oxygen or sulfur under heat and thereby remove the dispersing agent 22 from the metal particles 21 can be used. For example, acid anhydride, its derivatives or organic acid can be used as the catching agent 23. In the case where the acid anhydride or its derivatives are used, they react with amine-compounds or thyol-compounds as the dispersing agent 22 when they are heated and form ester or thioester. In this manner, the dispersing agent 22 covering the surface of the metal particles 21 is removed in the sintering process.

Figure 3:
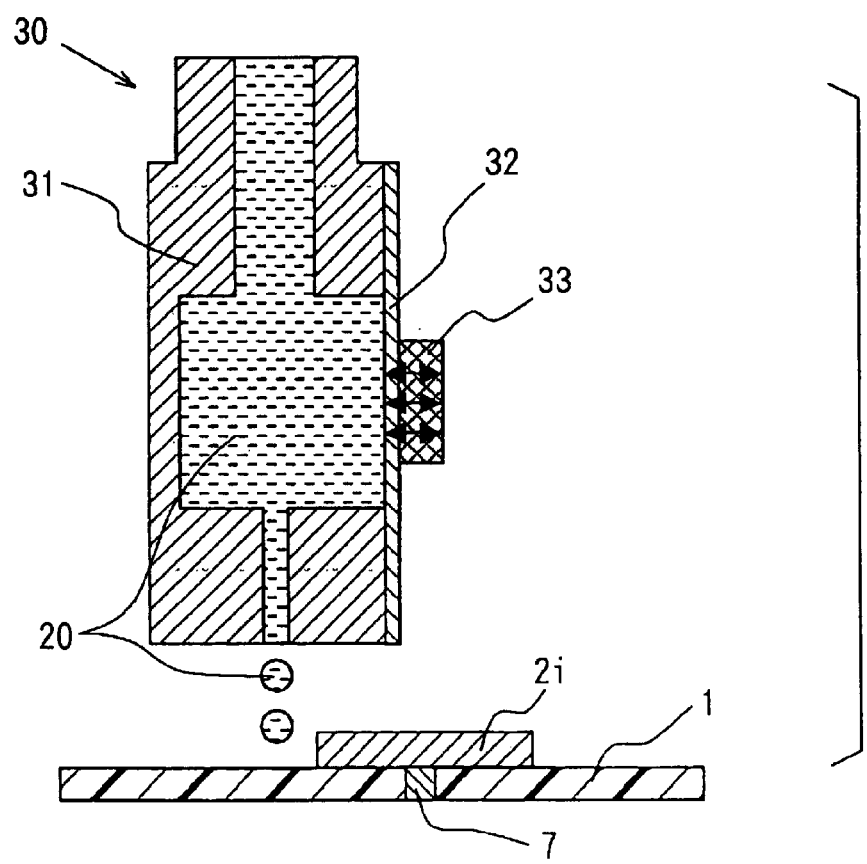
FIG. 3 is a cross-sectional view showing an ink injector and a resin film on which a circuit pattern is drawn by the ink injector.

FIG. 3 shows an ink injector 30 that draws the circuit pattern on the resin film 1 with the ink described above. The ink injector 30 is composed of an ink container 31 in which the ink 20 is contained, a wall plate 32 forming a part of the ink container 31, and a piezoelectric element 33 that vibrates the wall plate 32. The wall plate 32 is vibrated by applying voltage to the piezoelectric element 33, and the ink 20 is injected from the ink injector 30 to the surface of the resin film 1. The ink injector 30 or the resin film 1 is driven in X–Y directions as the ink is injected, and thereby the circuit pattern $2i$ is directly drawn with the ink 20 on the surface of the resin film 1.

An amount of the ink 20 included in a droplet injected from the ink injector 30 is very small, i.e., several to several tens pico-litter. For stably injecting such a small amount of ink, viscosity of the ink 20 is controlled to a level of several mPa·s.

The circuit pattern $2i$ drawn on the resin film 1 is dried (the solvent in the ink 20 is evaporated), and thereby the resin film 11, shown in FIG. 1E, having the circuit pattern $2i$ and the conductive paste 7 in the through-holes 6 is completed. As shown in FIG. 1E, the circuit pattern $2i$ is drawn in the position overlapping the through-hole 6 to thereby contact the conductive paste 7 in the through-hole 6. The resin film 11 having the circuit pattern $2i$ and the conductive paste 7 may be heated at 100–150° C. for provisionally sintering the circuit pattern $2i$ and the conductive paste 7 before the resin films 11 are laminated in the next process. By performing the provisional sintering, the resin films 11 can be handled more easily.

As described above, since the ink 20 including fine metal particles 21 (in the order of nanometers) is used, the circuit pattern $2i$ can be directly drawn on the resin film 1 by injecting the ink 20 from the ink injector 30. The photolithography mask for forming the circuit pattern is not necessary. Accordingly, any design changes in the circuit pattern $2i$ can be easily followed. By directly drawing the circuit pattern $2i$ on the resin film 1 without using the phtolithography process, the conventional process shown in FIGS. 6A–6G is greatly simplified.

Figure 4A:
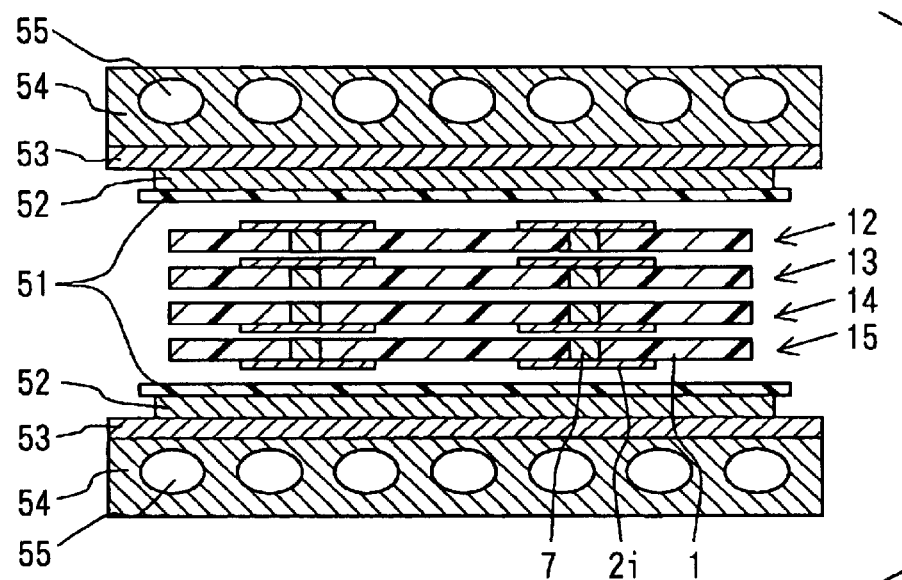
FIG. 4A is a cross-sectional view showing laminated resin films and dies for bonding the laminated resin films.
Figure 4B:
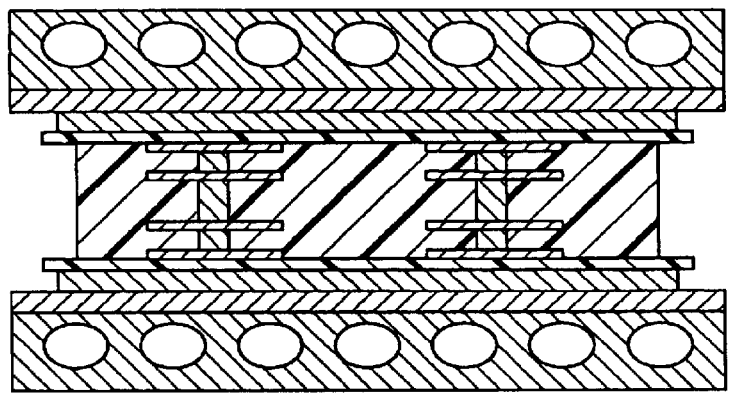
FIG. 4B is a cross-sectional view showing a step of bonding the laminated resin films together under pressure and heat.
Figure 4C:
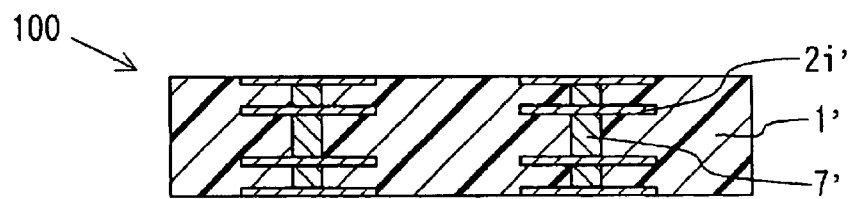
FIG. 4C is a cross-sectional view showing a multi-layer circuit board manufactured according to the present invention.

Referring to FIGS. 4A–4C, a process of laminating the resin film 11 on which the circuit pattern $2i$ is formed and a process of bonding the laminated resin films under pressure and heat will be described. The resin films 12–15, each of which is identical to the resin film 11 prepared in the process shown in FIGS. 1A–1E, are laminated as shown in FIG. 4A. The laminated resin films 12–15 are placed between a pair of pressing dies 54. Each pressing die 54 includes a separator film 51, a buffer plate 52 and a metallic plate 53 laminated in this order from the surface of the laminated resin films 12–15. A heater 55 is embedded in the pressing die 54 to heat the pressing die 54.

The separator film 51 placed between the surface of the laminated resin films 12–15 and the buffer plate 52 prevents the resin films from sticking to the buffer plate 52 or other portions in the process of bonding the resin films under pressure and heat. The separator film 51 also serves to prevent any damages on the surface of the resin film including the circuit pattern 2i. A polyimide film may be used as the separator film 51, for example. The buffer plates 52 are used for uniformly press the laminated resin films 12–15 from both surfaces thereof. The buffer plate 52 may be a plate having about 1 mm thickness formed from metallic fibers such as stainless steel fibers. The metallic plate 53 is used for protecting the pressing die 54 from any damages. The metallic plate 53 is made of, e.g., stainless steel (SUS) or titanium and has a thickness of about 2 mm. In case thermosetting resin such as epoxy resin including glass fibers is used as a material of resin film 1, adhesive is placed between neighboring resin films 12–15 when they are laminated.

The laminated resin films 12–15 are bonded together under pressure and heat in a process shown in FIG. 4B. First, the pair of pressing dies 54 is heated by the heater 55 for five minutes at a temperature lower than 150° C. Then, the laminated resin films are pressed under a pressure of 20 Kg/cm². Then, the die temperature is raised to 200–250° C., the laminated films are pressed and heated for 10–30 minutes. This process of pressing and heating can be performed in the usual atmosphere, but it is preferable to perform this process in a vacuum chamber in order to prevent oxidation of the metal particles contained in the ink 20 and the conductive paste 7.

By applying the pressure and heat to the laminated resin films 12–15, the resin films made of thermoplastic resin are bonded to one another. At the same time, the metal particles included in the circuit patterns 2i and the conductive paste 7 are sintered. Thus, a multi-layer circuit board 100 shown in FIG. 4C is completed. The laminated films made of the thermoplastic resin are bonded together, forming an insulator 1'. The circuit patterns 2i and the conductive paste 7 are sintered, thereby forming sintered circuit patterns 2i' and sintered conductors 7'.

Figure 5A:
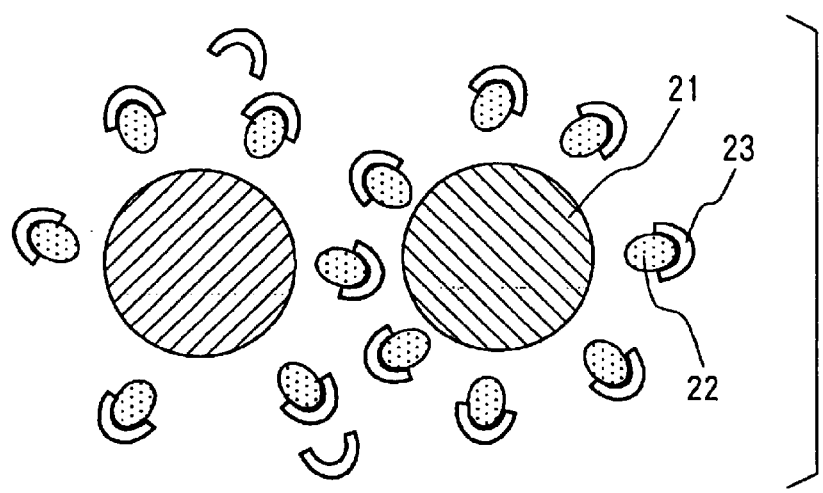
FIG. 5A is a schematic view showing a process of removing dispersing agent from a metal particle and catching the removed dispersing agent by catching agent.
Figure 5B:
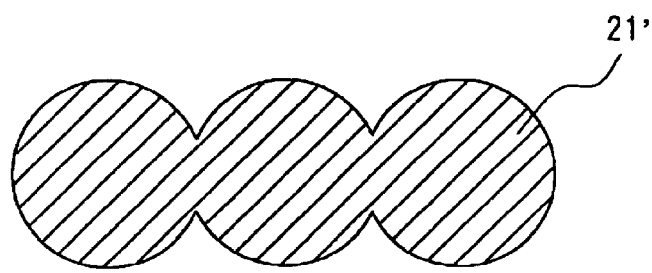
FIG. 5B is a schematic view showing metal particles connected to one another by sintering.
Figure 6A:
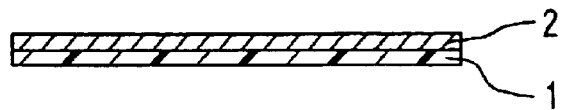
FIGS. 6A–6G are drawings showing a conventional process of manufacturing a resin film with a circuit pattern formed thereon and holes filled with conductive paste.
Figure 6B:
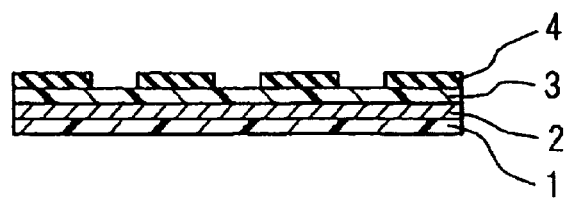
Figure 6C:
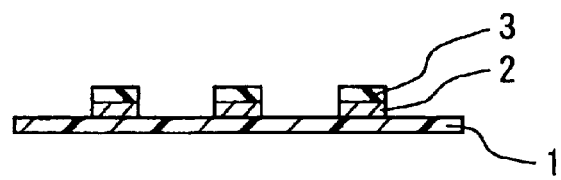
Figure 6D:
Figure 6E:
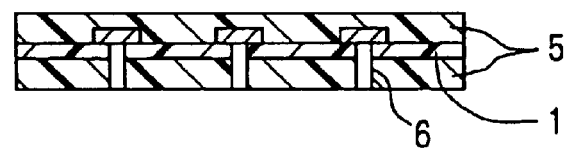
Figure 6F:
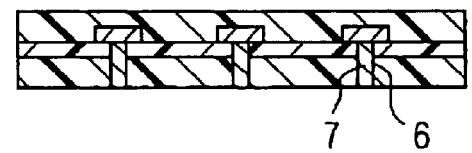
Figure 6G:
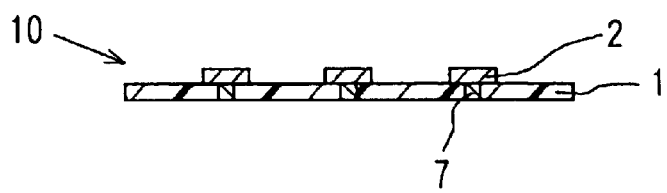

Referring to FIGS. 5A and 5B, the sintering process of the metal particles 21 contained in the ink 20 will be explained. As shown in FIG. 5A, in the early state of the sintering process, the dispersing agent 22 covering the surface of the metal particle 21 is caught by the catching agent 23. Thus, the dispersing agent 22 is removed from the surface of the metal particle 21, and the surfaces of active metal particles are exposed. As the sintering process further proceeds, the metal particles 21 contact one another and the metal particles 21 are connected to one another through their active surfaces, and thus forming the sintered metal particles 21'. When the silver (Ag) metal particles, each having a diameter less than 50 nanometers, are used as in the present embodiment, the metal particles can be sintered at about 200° C.

Since the metal particle 21 contained in the ink 20 has the diameter in the order of nanometers, the circuit pattern 2i can be sintered at a low temperature in the same process for bonding together the resin films 12–15. Further, the conductive paste 7 can be sintered at the same time. Therefore, the process of bonding and sintering is simplified.

The present invention is not limited to the embodiment described above, but it may be variously modified. For example, though the through-hole 6 is filled with the conductive paste 7 in the foregoing embodiment, it is also possible to fill the through-hole 6 with the same ink 20 as the ink for drawing the circuit pattern 2i. In this case the ink 20 may be supplied to the through-hole 6 by injecting the ink 20 from the ink injector 30. For filling the through-hole 6 closed by the protecting film 1c' with the ink 20, the ink 20 may be injected several times from the injector 30. After the through-hole 6 is filled with the ink 20, the solvent of the ink 20 is evaporated, or the ink 20 is provisionally sintered at a low temperature such as 100–150° C. In this manner, the resin film 1 can be easily handled in the next process of drawing the circuit pattern 2i. The ink 20 filling the through-hole 6 is sintered together with the ink 20 forming the circuit pattern 2i in the same manner as described above.

Though silver (Ag) is used in the ink 20 in the foregoing embodiment, other metals such as gold (Au), platinum (Pt) or tin (Sn) may be used in place of silver (Ag) Further, two or more kinds of metal particles may be mixed. For example, silver (Ag) particles having a diameter smaller than 50 nm and palladium (Pd) particles having a diameter smaller than 50 nm may be mixed. In this case, a resistor pattern having a higher electric resistance than the Ag circuit pattern can be formed, because an Ag—Pd alloy having a higher resistance than Ag is formed in the sintering process. When the resistor pattern formed by Ag—Pd is connected to the circuit pattern formed by Ag, a circuit pattern including a resistor pattern can be formed in the same process described above. In laminating the resin films, it is also possible to mix conventional resin films having a circuit pattern formed by etching a copper foil with the resin films having a circuit pattern formed by the process according to the present invention. Any number of the resin films made by the process of the present invention may be mixed with the conventional resin films.

While the present invention has been shown and described with reference to the foregoing preferred embodiment, it will be apparent to those skilled in the art that changes in form and detail may be made therein without departing from the scope of the invention as defined in the appended claims.

What is claimed is:

1. A method of manufacturing a multi-layer circuit board, the method comprising steps of:

forming a through-hole in a resin film;

filling the through-hole with conductive paste;

drawing a circuit pattern on a surface of the resin film by injecting ink including metal particles each having a diameter in the order of nanometers from an ink injector, the circuit pattern being drawn to contact the conductive paste in the through-hole;

laminating a plurality of the resin films, each having the circuit pattern and the through-hole filled with the conductive paste; and bonding the plurality of the resin films together by pressing the laminated resin films under heat, and sintering the circuit patterns and the conductive paste in the through-holes at the same time.

2. The method of manufacturing a multi-layer circuit board as in claim 1, wherein:

the method further includes a step of provisionally sintering the circuit pattern by heating the same, which is performed before the laminating step.

3. The method of manufacturing a multi-layer circuit board as in claim 1, wherein:

the conductive paste filling the through-hole is the same ink as the ink with which the circuit pattern is drawn; and the through-hole is filled with the ink by injecting the ink from the ink injector.

4. The method of manufacturing a multi-layer circuit board as in claim 3, wherein:

the method further includes a step of provisionally sintering the ink with which the circuit pattern is drawn and with which the through-hole is filled, which is performed before the laminating step.

5. The method of manufacturing a multi-layer circuit board as in claim 1, wherein:

the resin film is made of thermoplastic resin.

6. The method of manufacturing a multi-layer circuit board as in claim 1, wherein:

the diameter of the metal particles in the ink is smaller than 50 nanometers.

7. The method of manufacturing a multi-layer circuit board as in claim 1, wherein:

the circuit pattern includes a resistor pattern having an electrical resistance higher than other portions of the circuit pattern, the resistor pattern being drawn with the ink by changing kinds of metal particles included therein.

8. A multi-layer circuit board comprising:

a plurality of resin films laminated and bonded together;

a circuit pattern drawn on a surface of each resin film by ink including metal particles having a diameter in the order of nanometers, the circuit pattern being sintered; and a through-hole formed in each resin film and filled with conductive paste, the conductive paste being sintered, thereby forming a conductor electrically connecting the neighboring circuit patterns.

9. The multi-layer circuit board as in claim 8, wherein:

the conductive paste filling the through-hole is the same ink as the ink with which the circuit pattern is drawn.

10. The multi-layer circuit board as in claim 8, wherein:

the resin film is made of thermoplastic resin.

11. The multi-layer circuit board as in claim 8, wherein:

the circuit pattern includes a resistor pattern having an electrical resistance higher than other portions of the circuit pattern, the resistor pattern being drawn with the ink including metal particles that are different from the metal particles included in the ink with which other portions of the circuit pattern are drawn.

* * * * *